United States Patent
Tille et al.

(10) Patent No.: US 10,434,839 B2
(45) Date of Patent: Oct. 8, 2019

(54) OPERATOR CONTROL OF AN AIR-CONDITIONING SYSTEM FOR THE PASSENGER COMPARTMENT OF A MOTOR VEHICLE

(71) Applicant: Bayerische Motoren Werke Aktiengesellschaft, Munich (DE)

(72) Inventors: Thomas Tille, Munich (DE); Anton Sappler, Munich (DE); Florian Miedl, Munich (DE); Thomas Gerstl, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 267 days.

(21) Appl. No.: 15/293,670

(22) Filed: Oct. 14, 2016

(65) Prior Publication Data
US 2017/0028818 A1 Feb. 2, 2017

Related U.S. Application Data

(63) Continuation of application No. PCT/EP2015/057797, filed on Apr. 10, 2015.

(30) Foreign Application Priority Data

Apr. 17, 2014 (DE) .................. 10 2014 207 383

(51) Int. Cl.
*B60H 1/00* (2006.01)
*H03K 17/96* (2006.01)

(52) U.S. Cl.
CPC ..... *B60H 1/00985* (2013.01); *B60H 1/00064* (2013.01); *B60H 1/0065* (2013.01); *H03K 17/96* (2013.01); *H03K 2217/96066* (2013.01)

(58) Field of Classification Search
None
See application file for complete search history.

(56) References Cited

U.S. PATENT DOCUMENTS

| 6,758,265 B2 | 7/2004 | Henry et al. |
| 2003/0070437 A1* | 4/2003 | Hafner ............... B60H 1/00985 62/127 |

(Continued)

FOREIGN PATENT DOCUMENTS

| CN | 202071786 U | 12/2011 |
| DE | 602 05 437 T2 | 5/2006 |

(Continued)

OTHER PUBLICATIONS

Chinese-language Office Action issued in counterpart Chinese Application No. 201580019159.0 dated Dec. 8, 2017 with English translation (13 pages).

(Continued)

*Primary Examiner* — Shelley Chen
(74) *Attorney, Agent, or Firm* — Crowell & Moring LLP

(57) ABSTRACT

An air-conditioning system for the passenger compartment of a motor vehicle is provided, wherein the air conditioning system has at least one operator control unit and at least two air outlets. The operator control unit has a touch-sensitive strip. The air-conditioning system is configured to perform the following: separate control of the temperature of the air which flows out of the first air outlet and the temperature of the air which flows out of the second air outlet; determination of the temperature of the air for the first and the second air outlets independently of one another, and as a function of sensed contact with the strip.

18 Claims, 4 Drawing Sheets

(56) References Cited

U.S. PATENT DOCUMENTS

| | | | |
|---|---|---|---|
| 2003/0102120 A1 | 6/2003 | Henry et al. | |
| 2005/0133347 A1 | 6/2005 | Hein | |
| 2007/0144874 A1 | 6/2007 | Dorwarth et al. | |
| 2009/0312900 A1* | 12/2009 | Tschirhart | B60H 1/00985 701/36 |
| 2010/0327070 A1 | 12/2010 | Bouchard | |
| 2013/0002605 A1* | 1/2013 | Leuchtenberg | B60K 35/00 345/174 |
| 2014/0232675 A1* | 8/2014 | Yamamoto | G06F 3/0416 345/173 |

FOREIGN PATENT DOCUMENTS

| | | | | |
|---|---|---|---|---|
| DE | 10 2009 026 902 A1 | | 1/2010 | |
| DE | 10 2008 046 625 A1 | | 4/2010 | |
| DE | 102008046625 A1 | * | 4/2010 | ......... B60H 1/00985 |
| DE | 10 2010 010 441 A1 | | 8/2011 | |
| DE | 10 2013 005 027 A1 | | 10/2013 | |
| DE | 11 2012 003 943 T5 | | 7/2014 | |
| EP | 1 291 205 A2 | | 3/2003 | |
| JP | 2013-134546 A | | 7/2013 | |
| JP | 2013134546 A | * | 7/2013 | |
| KR | 10-2012-0061218 A | | 6/2012 | |
| WO | WO 2006/027259 A1 | | 3/2006 | |
| WO | WO 2009/143924 A1 | | 12/2009 | |
| WO | WO 2014/026854 A1 | | 2/2014 | |

OTHER PUBLICATIONS

International Search Report (PCT/ISA/210) issued in PCT Application No. PCT/EP2015/057797 dated Jul. 8, 2015 with English-language translation (six (6) pages).

German-language Written Opinion (PCT/ISA/237) issued in PCT Application No. PCT/EP2015/057797 dated Jul. 8, 2015 (six (6) pages).

German Search Report issued in counterpart German Application No. 10 2014 207 383.9 dated Sep. 14, 2015 with partial English-language translation (twelve (12) pages).

\* cited by examiner

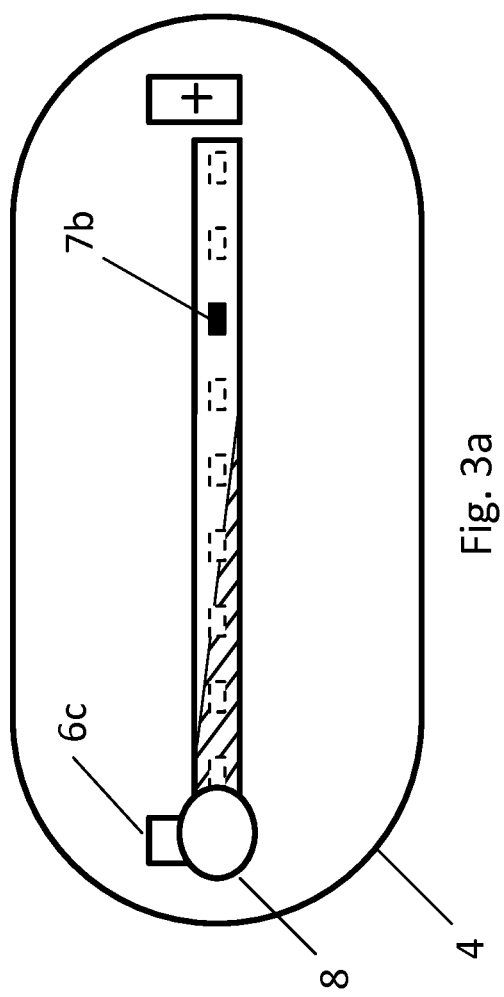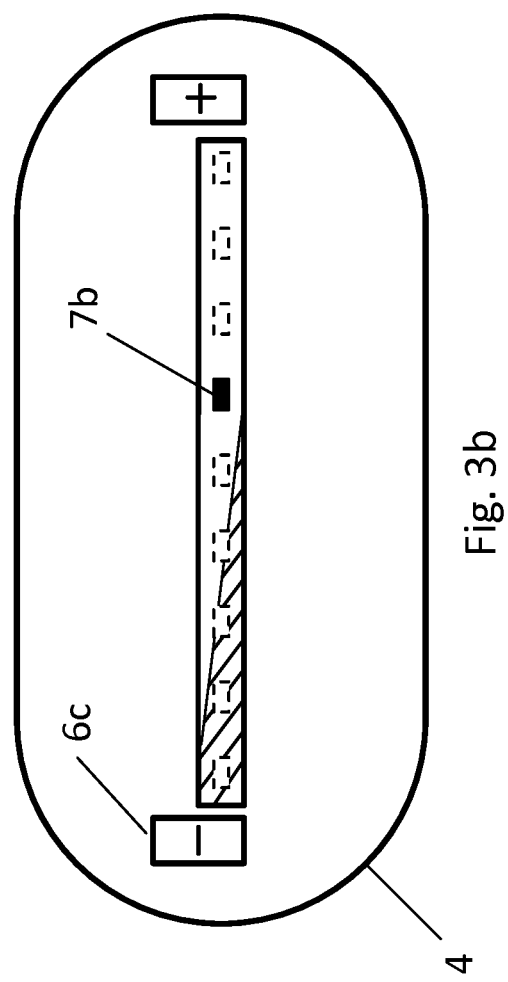

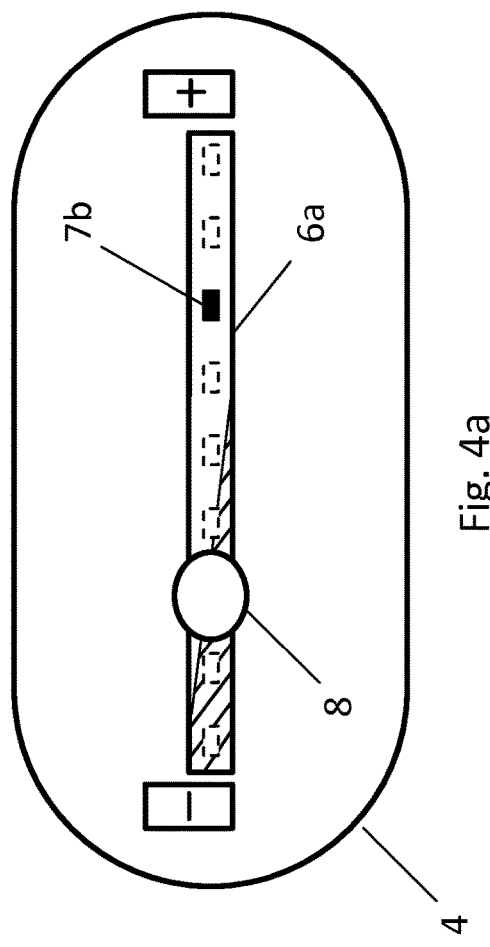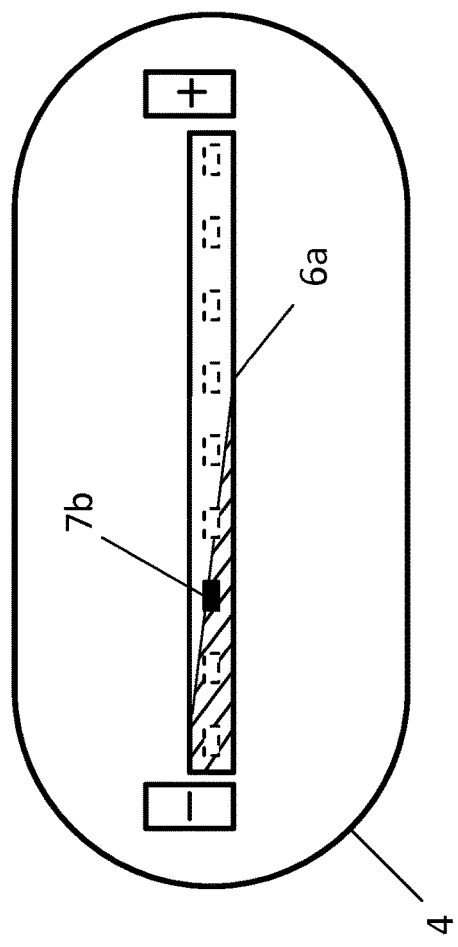

OPERATOR CONTROL OF AN AIR-CONDITIONING SYSTEM FOR THE PASSENGER COMPARTMENT OF A MOTOR VEHICLE

CROSS REFERENCE TO RELATED APPLICATIONS

This application is a continuation of PCT International Application No. PCT/EP2015/057797, filed Apr. 10, 2015, which claims priority under 35 U.S.C. § 119 from German Patent Application No. 10 2014 207 383.9, filed Apr. 17, 2014, the entire disclosures of which are herein expressly incorporated by reference.

BACKGROUND AND SUMMARY OF THE INVENTION

The invention relates to an air-conditioning system for the passenger compartment of a motor vehicle as well as to a method of operating the air-conditioning system.

Air-conditioning systems for motor vehicles, particularly for passenger cars, are well known. They comprise a unit, which provides air of a desired temperature, as well as air ducts and air outlets. The operator control of the air-conditioning system takes place by way of operator control units usually arranged in the dashboard of the motor vehicle. Modern air-conditioning units permit the setting of a desired temperature. The reaching and/or maintaining of this desired temperature is monitored by the air-conditioning unit by wayof temperature sensors, and is ensured by the suitable selection of the temperature of the outflowing air (desired temperature of the outflowing air). The operator control of the air-conditioning systems usually takes place by way of an operating panel which has rotary buttons or rotary controls, by way of which the desired temperature is set.

Air conditioning systems of this type usually have several air outlets in the passenger compartment of the vehicle, some arranged in the foot well and some arranged in the upper area of the dashboard at the level of the steering wheel. Furthermore, air outlets can also be used for defrosting purposes and therefore may be directed, for example, at the vehicle windows. In order to make it possible for the vehicle occupants to adjust the temperature as appropriately as possible, current air-conditioning systems of some vehicles made by BMW AG offer the possibility of adjusting the temperature layering by use of a knurl. On the basis of the desired temperature and the temperature for the outflowing air determined by the air-conditioning system, the temperature difference existing between the air flowing out in the foot well and the air flowing out at the level of the steering wheel is further defined by the user. By means of the knurl, the occupant of the vehicle can therefore set a temperature layering that provides a higher outflow temperature at the level of the steering wheel than in the foot well. As an alternative, by means of the knurl, only the outflow temperature at the level of the steering wheel can be changed and the outflow temperature in the foot well will thereby not be affected.

As mentioned above, the operator control of the temperature layering takes place by use of a knurl. It is an object of the invention specified herein to provide an alternative operator control unit for the temperature layering.

An aspect of the invention relates to an air-conditioning system for the passenger compartment of a motor vehicle, wherein the air-conditioning system comprises an operator control unit, at least two air outlets, and a touch-sensitive strip. The air-conditioning system is configured for: separately controlling the temperature of the air flowing out of the first air outlet, and the temperature of the air flowing out of second air outlet; determining the temperature of the air for the first and second air outlet, respectively, independently of one another and as a function of the detected contacts with the touch sensitive strip. One of the air outlets is typically arranged in the foot well of the vehicle occupant compartment, and one is arranged in the dashboard at the level of the steering wheel. Likewise, one of the air outlets can also be provided for defrosting purposes. In other words, it may be oriented such that the air flows directly onto the vehicle windows. A defrosting air layer plane can thereby be formed. The air-conditioning system may comprise additional air outlets, the additional air outlets being supplied with air like one of the two air outlets. The sensitivity to touch of the strip can be implemented by using technologies known from the state of the art, for example, by means of resistance changes (resistively), optical effects or capacitive effects.

It is therefore provided here that the operating element for the temperature layering be constructed in a touch-sensitive fashion. Instead of the knurl, a linear operator control unit for adjusting the temperature layering is therefore offered to the user. Furthermore, the operator control does not take place by way of a mechanically movable element, but on the basis of a detected touching. The further development of the operating element as a contact-sensitive strip has the advantage that the service life of the operating element is increased. The sensitivity to touch makes it possible to design the operator control unit as a closed surface without openings, which facilitates cleaning and prevents a dirtying of internal parts. Furthermore, the control operability of the device is also not impaired by the mechanical service life of the bearing or of the rotating mechanism of the knurl and its sensors.

The touch-sensitive strip may be understood to be an oblong surface, thus generally a surface whose dimension in one direction is larger (longitudinal direction) than the dimension in a direction perpendicular thereto (transverse direction). In this case, the strip does not have to have a uniform dimension in the transverse direction but may have a different "thickness" along the longitudinal direction. Furthermore, the strip may have a curved shape or, in a special case, may represent a segment of a circle and thereby at least approximately replicate a rotary actuator. The longitudinal and transverse direction will then relate to the course of the strip and follow the curve or the segment of the circle. The strip can replicate a rotary actuator in its shape. The touch-sensitive strip may generally also be called a touch-sensitive area.

The touch-sensitive strip may consist of a layer structure, the touching taking place on the uppermost layer. Typically, the strip comprises at least a layer for measuring capacities between electrodes and a protective layer. In addition, layers may also be provided which contribute to a visually attractive design. The uppermost layer may have a dimension and shape that is significantly larger than those of the layer for the measuring and, in particular, form a larger, visible portion of a dashboard.

The touch-sensitive strip can be arranged adjacent to and below air outlets, but also in an operating element of the air-conditioning system separated from the air outlets.

In an advantageous further development, the operator control unit is configured in a first area for: detecting the position of the touching of the strip along a longitudinal dimension of the strip. The air-conditioning unit is configured for the following: in response to the detection of a touching in the first area of the strip, setting the temperature of the air for the first and second air outlet as a function of the position of the touching along the longitudinal dimension of the strip, wherein particularly the temperature of the second air outlet may also remain unchanged. Here, an assignment of the absolute position of the touching relative to the longitudinal dimension of the strip and the air temperature is therefore carried out. In this case, the air temperature for the first and the second air outlet is determined separately from, and independently of, one another. It may be provided that the temperature for one of the air outlets remains unchanged, while the temperature for the other air outlet is changed.

The set temperature of the air for the first air outlet is typically higher with respect to a desired temperature when the touching is detected in a first half of the longitudinal dimension of the strip; wherein the set temperature for the air for the first air outlet is lower with respect to a desired temperature when the touching is detected in the second half of the longitudinal dimension of the strip. An absolute deviation or a relative deviation (a factor) with respect to a desired temperature of the air flowing out of the first outlet may be assigned to every position along the longitudinal dimension of the strip. For example, a temperature increase by 2° C. or by the factor 1.1 for the first air outlet can be assigned to a touching at a ¾ position, thus at 75% r of the length of the dimension (measured from one end of the strip). The desired temperature of the air for an outlet is obtained from the controlling of the vehicle occupant compartment temperature by the air-conditioning system according to the specified desired temperature, assuming that no change of the standard air layering was input by the user.

In a preferred implementation, the operator control unit is further configured for the following: detecting the touching of a second area of the strip, the second area being arranged at a first end of the strip; detecting the touching of a third area of the strip, the third area being arranged at the second end of the strip. The air-conditioning system is configured for: in response to the detecting of a touching in a first or second area of the strip, changing the temperature of the air for the first air outlet (on the basis of the desired temperature) by a value or factor assigned to the respective area and changing the temperature of the air for the second air outlet (based on the desired temperature) by another value or factor than the assigned value or factor, wherein the value or factor assigned to the first area is greater than 0° C. or 1 and the value or factor assigned to the second area is lower than 0° C. or 1. It is therefore suggested here that, when the ends of the strip are touched, the air temperature will be increased or decreased by one temperature step respectively based on the desired air temperature. This is sometimes also called "toggling". The temperature step may, for example, be 1° C. This temperature step relates to the air temperature for the first air outlet. The temperature for the second air outlet changes in a different manner, for example, precisely conversely, thus, for example, −1° C., or in a different manner, for example, −1.5° C. The second and third area may each be offset from the first area. There may therefore be a space between the respective areas, in which case, no user input will be detected when this space is touched.

The strip may comprise individual sensor surfaces in the first area, which are arranged along the longitudinal dimension of the strip in a row and typically at a uniform distance from one another. By means of the sensor surfaces (which are situated under a protective or possibly decorative layer), the touching of the strip is detected, for the purpose of which capacitive effects are utilized. The detection of a touching is carried out by way of an electronic analyzing unit, which is part of the operator control unit of the air-conditioning system. The strip typically also comprises sensor surfaces in the second and third area, in which case these do not necessarily have to be arranged in the same row and in the same spacing as the sensor surfaces of the first area.

In addition, the operator control unit may further comprise luminous elements arranged in a row; and in which case, the air-conditioning system is also configured for the following: activating one or more luminous elements such that the position of the activated luminous element or elements with respect to the longitudinal dimensions of the row represents the air temperature determined for the first air outlet. The luminous elements are typical LEDs and may also comprise optical fibers. It is therefore suggested here to provide the user with a visual acknowledgment, as to which temperature layer he has selected. This acknowledgment does not necessarily supply precise information concerning the temperature (in ° C. ° F.), but may be purely relative and may only be the just selected setting with respect to the entire conceivable setting range. This is achieved by the relative positioning of the activated element with respect to the total dimension (in the longitudinal direction) of the strip.

The row of luminous elements may superimpose itself at least partially in the longitudinal dimension on the touch-sensitive strip. The visual acknowledgment therefore takes place at points at which inputs can also be made. The luminous elements are typically arranged above and/or beside the sensor unit, so that one can see the luminous elements when touching the sensor unit.

In a variant, the first area comprises two unconnected partial areas, and the operator control unit is further configured for the following: detecting the touching of the strip in a fourth area; wherein the fourth area in the longitudinal dimension is arranged between the two partial areas of the first area. The air-conditioning system is configured for the following: in response to the detection of a touching in the fourth area of the strip, setting the temperature of the air for the first and second air outlet to the respective previously determined desired temperature. In this manner, a resetting into the default is permitted and a possibly set layer distribution is eliminated. The separate fourth area is preferably arranged in the center between the ends of the strip.

In another aspect, a motor vehicle, particularly a passenger car, comprises one of the above-described air-conditioning systems.

In a further aspect, a method of controlling the temperature layering comprises an air-conditioning system for the occupant compartment of a motor vehicle, the air-conditioning system includes an operator control unit and at least two air outlets. The operator control unit includes a touch-sensitive strip for a separate controlling of the temperature of the air flowing out of the first air outlet, and of the temperature of the air flowing out of the second air outlet, and for determining the temperature of the air for the first and second air outlet respectively independently of one another and as a function of detected contacts with the strip. The process can be further developed by the steps carried out by one of the above-described air-conditioning systems.

Other objects, advantages and novel features of the present invention will become apparent from the following detailed description of one or more preferred embodiments when considered in conjunction with the accompanying drawings.

BRIEF DESCRIPTION OF THE DRAWINGS

FIGS. 3a and 3b schematically illustrate a function of the operator control unit according to the embodiment.

FIGS. 4a and 4b schematically illustrate a function of the operator control unit according to the embodiment.

Identical reference symbols relate to corresponding elements covering all figures.

DETAILED DESCRIPTION OF THE DRAWINGS

Figure 1:
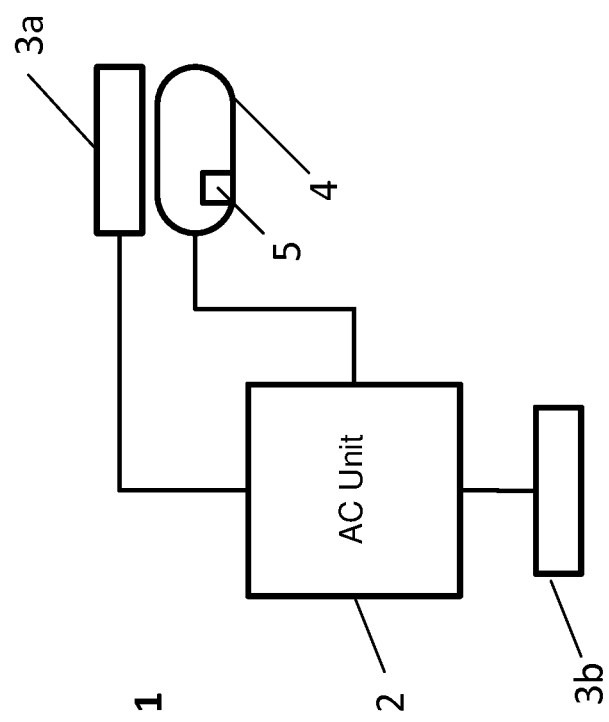
FIG. 1 is a schematic block diagram of an air-conditioning system according to an embodiment of the invention.

FIG. 1 schematically illustrates an air-conditioning system 1 according to an embodiment. The air-conditioning system 1 includes a unit 2, which provides air of the desired temperature, as well as the air outlets 3a and 3b. The air outlet 3a is situated in the center console of a dashboard of a vehicle (not shown) and is connected by way of air ducts (for example, tubes) with the unit 2. An air outlet 3b is arranged in the foot well of the passenger compartment and is also connected with the unit 2 by way of air ducts. In addition to an operating panel (not shown) for setting the desired temperature and further setting possibilities of the air-conditioning system, the air-conditioning system has an operator control unit 4. The operator control unit 4 is arranged below the air outlet 3a and also includes an electronic analyzing unit 5, which analyzes operating input at the operator control unit 4 and electronically reports it to the unit 2. The air-conditioning system 1 is designed for carrying out a temperature layering within the scope of the specified desired temperature; i.e. for adapting the respective temperature of the air actually determined by the unit 2 for the respective outlet 3a and 3b according to the user's input at the operator control unit 4.

Figure 2:
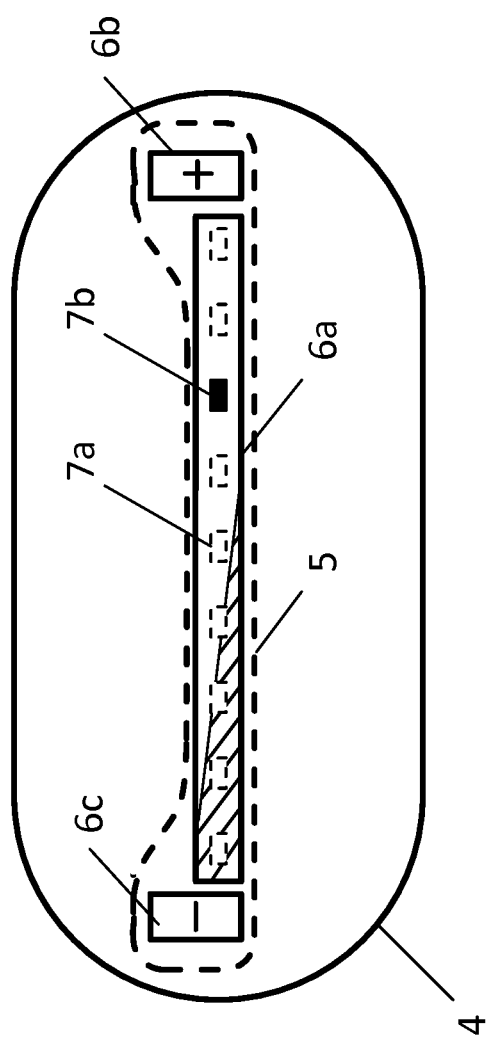
FIG. 2 is a schematic view of an operator control unit according to an embodiment.

FIG. 2 is a schematic view of an operator control unit 4 according to an embodiment. The operator control unit 1 includes a touch-sensitive strip 5, which is arranged behind a screen, so that the user cannot recognize the strip 5 (in FIG. 2 outlined by a broken line). The touch-sensitive strip 5 has individual sensor elements, which are arranged below the LEDs 7a, but can detect touching in the area of the strip 5. In alternative embodiments, the sensor elements are arranged between or around the LEDs. As an alternative, the sensor elements are made of a transparent material and can then be superimposed on the LEDs.

A first area 6a is displayed on the screen of the operator control unit 4, for example, by a line-type bordering. Furthermore, a second area 6b and a third area 6c are, for example, also displayed by a line-type bordering. The closed shapes created for surfaces 6a, 6b and 6c may also be colored, for example, red or blue. In addition, in area 6a, a change of color is symbolized by use of cross-hatching from the non-cross-hatched area to the cross-hatched area. LEDs 7a, 7b are also integrated as luminous elements in the operator control unit. In the deactivated state, the LEDs 7a are typically not visible when looking at the screen (outlined by a broken bordering in FIG. 2). An activated LED 7b is visible as a light spot from the outside, which is indicated in FIG. 2 by a filling-in.

During operation, the state of the temperature layering is indicated by the activated LED. In the present case, a step from one LED to the next represents a change of temperature of 1° C. of the air for the air outlet 3a and an opposite temperature change by 1° C. (or, for example, 0.7° C.) for the air outlet 3b. A step in the direction of area 6b represents an increase of the air temperature by 1° C. for the air outlet 3a; a step in the direction of area 6c represents a temperature reduction by 1° C. for the air outlet 3a. An activated LED in the center position of the nine LEDs represents the state when no temperature layering is carried out according to user input.

FIGS. 3a and 3b schematically explain the change of the temperature layering in individual steps by use of the operator control unit 4. During operation, the operator control unit 4 recognizes a touching 8 in area 6c by way of the touch-sensitive strip. In response to the above, the temperature previously provided for the respective air outlet will be changed by 1° C.: The temperature of the air for the air outlet 3a will be reduced by 1° C., and the air temperature for the air outlet 3b will be increased by 1° C. The activation of the LEDs is simultaneously changed. The previously active LED 7b in FIG. 3a is deactivated, and the next LED in the direction of area 6c will be activated, so that finally only the LED 7b in FIG. 3b is activated. The operator control input can be repeated until the desired temperature layering has been achieved.

FIGS. 4a and 4b schematically explain the change of the temperature layering by use of the operator control unit 4 by direct selection of the layering. During the operation, the user touches the point of area 6a that corresponds to the desired temperature layering, for this purpose. In FIG. 4a, the area 6a is touched at point 8. The temperature layering is set corresponding to the position of the touching relative to the entire longitudinal dimension of the area 6a. In FIG. 4a, the user touches the second LED on the left, viewed from the center position. This means that the temperature for the air outlet 3a is reduced by 2° C. with respect to the temperature for the air outlet 3a provided by the unit 2. Simultaneously, the temperature for the air outlet 3b is increased by 2° C.

The touching of the area 6a in its center of the longitudinal dimension results in the elimination of the temperature layering. The center area around the center LED can be characterized separately.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. An air-conditioning system for a passenger compartment of a motor vehicle, the air-conditioning system comprising:
    an operator control unit,
    at least two air outlets,
    wherein the operator control unit comprises a touch-sensitive strip, and
    wherein the air-conditioning system is configured to:
    detect a touch of the touch-sensitive strip by a user,
    separately control temperature of air flowing out of a first air outlet and a temperature of an air flowing out of a second air outlet, and
    determine a temperature of air for both the first and the second air outlets, respectively, as a function of only the detected touch of the touch-sensitive strip by the user,
    wherein the determined temperature of air for the first air outlet is different than the determined temperature of air for the second air outlet.

2. The air-conditioning system according to claim 1, wherein the operator control unit is configured to:
- in a first area, detect a position of the touch of the touch-sensitive strip along a longitudinal dimension of the strip, wherein the air-conditioning system is further configured to:
- in response to detecting the touch in the first area of the touch-sensitive strip, setting the temperature of the air for both the first and the second air outlets as a function of only the position of the touch along the longitudinal dimension of the strip.

3. The air-conditioning system according to claim 2, wherein a set temperature of air for the first air outlet is higher with respect to a desired temperature when the touch is detected in a first half of the longitudinal dimension of the strip, and
wherein a set temperature of air for the first air outlet is lower with respect to a desired temperature when the touch is detected in a second half of the longitudinal dimension of the strip.

4. The air-conditioning system according to claim 2, wherein the operator control unit is further configured to:
- detect a touch of a second area of the strip, the second area being arranged at a first end of the strip,
- detect a touch of a third area of the strip, the third area being arranged at a second end of the strip, wherein the air-conditioning system is further configured to:
- in response to the detection of the touch of the first or the second area of the strip, change the temperature of air for the first air outlet by a value or factor assigned to the respective area, and change the temperature of air for the second air outlet by a different value or factor than the assigned value or factor,
- wherein the value or factor assigned to the first area is greater than 0° C. or 1, and the value or factor assigned to the second area is lower than 0° C. or 1.

5. The air-conditioning system according to claim 3, wherein the operator control unit is further configured to:
- detect the touch of a second area of the strip, the second area being arranged at a first end of the strip,
- detect the touch of a third area of the strip, the third area being arranged at a second end of the strip, wherein the air-conditioning system is further configured to:
- in response to the detection of the touch of the first or the second area of the strip, change the temperature of air for the first air outlet by a value or factor assigned to the respective area, and change the temperature of air for the second air outlet by a different value or factor than the assigned value or factor,
- wherein the value or factor assigned to the first area is greater than 0° C. or 1, and the value or factor assigned to the second area is lower than 0° C. or 1.

6. The air-conditioning system according to claim 2, wherein the touch-sensitive strip comprises individual sensor surfaces in the first area, which are arranged in a row along the longitudinal dimension of the strip.

7. The air-conditioning system according to claim 1, wherein:
- the operator control unit further comprises luminous elements arranged in a row, and
- the air-conditioning system is further configured to:
- activate one of more of the luminous elements such that a position of the activated luminous element or elements with respect to the longitudinal dimension of the row represents the air temperature determined for the first air outlet.

8. The air-conditioning system according to claim 7, wherein the row of luminous elements is superimposed on the touch-sensitive strip at least partially in the longitudinal direction.

9. The air-conditioning system according to claim 4, wherein:
- the first area has two unconnected partial areas,
- the operator control unit is further configured to:
- detect a touch of the strip in a fourth area, the fourth area being arranged in the longitudinal dimension between the two partial areas of the first area, wherein the air-conditioning system is further configured to:
- in response to the detection of the touch of the fourth area of the strip, set the temperature of air for both the first and the second air outlets to the respective previously determined desired temperature.

10. A motor vehicle, comprising an air-conditioning system according to claim 1.

11. The motor vehicle according to claim 10, wherein the operator control unit is configured to:
- in a first area, detect a position of the touch of the touch-sensitive strip along a longitudinal dimension of the strip, wherein the air-conditioning system is further configured to:
- in response to detecting the touch of the first area of the touch-sensitive strip, setting the temperature of air for both the first and the second air outlets as a function of the position of the touch along the longitudinal dimension of the strip.

12. The motor vehicle according to claim 10, wherein a set temperature of air for the first air outlet is higher with respect to a desired temperature when the touch is detected in a first half of the longitudinal dimension of the strip, and
wherein a set temperature of air for the first air outlet is lower with respect to a desired temperature when the touch is detected in a second half of the longitudinal dimension of the strip.

13. The motor vehicle according to claim 11, wherein the operator control unit is further configured to:
- detect a touch of a second area of the strip, the second area being arranged at a first end of the strip,
- detect a touch of a third area of the strip, the third area being arranged at a second end of the strip, wherein the air-conditioning system is further configured to:
- in response to the detection of the touch of the first or the second area of the strip, change the temperature of air for the first air outlet by a value or factor assigned to the respective area, and change the temperature of air for the second air outlet by a different value or factor than the assigned value or factor,
- wherein the value or factor assigned to the first area is greater than 0° C. or 1, and the value or factor assigned to the second area is lower than 0° C. or 1.

14. The motor vehicle according to claim 11, wherein the touch-sensitive strip comprises individual sensor surfaces in the first area, which are arranged in a row along the longitudinal dimension of the strip.

15. The motor vehicle according to claim 10, wherein:
- the operator control unit further comprises luminous elements arranged in a row, and the air-conditioning system is further configured to:
activate one of more of the luminous elements such that a position of the activated luminous element or elements with respect to the longitudinal dimension of the row represents the air temperature determined for the first air outlet.

16. The motor vehicle according to claim 15, wherein the row of luminous elements is superimposed on the touch-sensitive strip at least partially in the longitudinal direction.

17. The motor vehicle according to claim 10, wherein the first area has two unconnected partial areas,
the operator control unit is further configured to:
detect a touch of the strip in a fourth area, the fourth area being arranged in the longitudinal dimension between the two partial areas of the first area,
wherein the air-conditioning system is further configured to:
in response to the detection of the touch of the fourth area of the strip, set the temperature of air for both the first and the second air outlets to the respective previously determined desired temperature.

18. A method of controlling temperature layering of an air-conditioning system for a passenger compartment of a motor vehicle, the air-conditioning system comprising an operator control unit and at least two air outlets, and the operator control unit comprising a touch-sensitive strip,
the method comprising the acts of:
separately controlling temperature of air flowing out of the first air outlet and the temperature of air flowing out of the second air outlet, and
determining a temperature of air for the first and the second air outlet respectively as a function of only a detected touch of the strip by a user,
wherein the determined temperature of air for the first air outlet is different than the determined temperature of air for the second air outlet.

* * * * *